(12) United States Patent
Matsumoto et al.

(10) Patent No.: US 10,040,283 B2
(45) Date of Patent: Aug. 7, 2018

(54) SEMICONDUCTOR DEVICE AND LIQUID DISCHARGE HEAD SUBSTRATE

(71) Applicant: CANON KABUSHIKI KAISHA, Tokyo (JP)

(72) Inventors: Kohei Matsumoto, Tokyo (JP); Kazunari Fujii, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/460,408

(22) Filed: Mar. 16, 2017

(65) Prior Publication Data

US 2017/0291415 A1    Oct. 12, 2017

(30) Foreign Application Priority Data

Apr. 7, 2016 (JP) ................................. 2016-077579

(51) Int. Cl.
| | |
|---|---|
| *B41J 2/14* | (2006.01) |
| *H01L 27/02* | (2006.01) |
| *H02H 9/04* | (2006.01) |
| *H01L 21/762* | (2006.01) |
| *H01L 29/78* | (2006.01) |

(52) U.S. Cl.
CPC ............ *B41J 2/14* (2013.01); *H01L 27/0281* (2013.01); *H01L 27/0285* (2013.01); *H01L 27/0288* (2013.01); *H01L 27/0292* (2013.01); *H02H 9/045* (2013.01); *H01L 21/76202* (2013.01); *H01L 29/7816* (2013.01)

(58) Field of Classification Search
None
See application file for complete search history.

(56) References Cited

U.S. PATENT DOCUMENTS

| | | | |
|---|---|---|---|
| 6,072,682 A | 6/2000 | Ravanelli et al. | 361/111 |
| 7,910,950 B1 | 3/2011 | Vashchenko | 257/124 |
| 9,302,478 B2 | 4/2016 | Suzuki et al. | B41J 2/135 |
| 9,505,211 B2 | 11/2016 | Fujii et al. | B41J 2/04541 |

(Continued)

FOREIGN PATENT DOCUMENTS

| | | |
|---|---|---|
| JP | H10-209292 | 8/1998 |
| WO | WO 2008/155729 A | 12/2008 |

OTHER PUBLICATIONS

J. Park et al., "Design of a Latchup-Free ESD Power Clamp for Smart Power ICs", *Journal of Semiconductor Technology and Science*, vol. 8, No. 3, pp. 227-231 (Sep. 2008).

(Continued)

*Primary Examiner* — Lisa M Solomon
(74) *Attorney, Agent, or Firm* — Fitzpatrick, Cella, Harper & Scinto

(57) ABSTRACT

A semiconductor device is provided. The device comprises: a first transistor that includes a first primary terminal, a second primary terminal and a first control terminal; a second transistor that includes a third primary terminal, a fourth primary terminal and a second control terminal; and a resistive element. The first and third primary terminal are connected to a first voltage line. The second primary terminal and one terminal of the resistive element are connected to a second voltage line. The first and second control terminal, the fourth primary terminal and the other terminal of the resistive element are connected to a node. A potential change in the third primary terminal is transmitted to the first control terminal by capacitive coupling between the third primary terminal and the node, turning on the first transistor.

28 Claims, 3 Drawing Sheets

(56) References Cited

U.S. PATENT DOCUMENTS

2001/0020643 A1   9/2001   Matsumoto et al. .... G06K 7/10
2010/0232081 A1   9/2010   Disney
2014/0078223 A1   3/2014   Ohmura .......................... 347/56

OTHER PUBLICATIONS

L. Sponton et al., "ESD Protection Structures for BCD5 Smart Power Technologies", *Microelectronics Reliability*, vol. 41, pp. 1683-1687 (2001).
EESR issued Aug. 4, 2017 in counterpart European Patent Application 17162692.2 (in English).
Russian Search Report issued in corresponding Russian Application No. 2017111580/28 dated May 16, 2018.
Russian Office Action issued in corresponding Russian Application No. 2017111580/28 dated May 18, 2018.

SEMICONDUCTOR DEVICE AND LIQUID DISCHARGE HEAD SUBSTRATE

BACKGROUND OF THE INVENTION

Field of the Invention

The present invention relates to a semiconductor device and a liquid discharge head substrate.

Description of the Related Art

Japanese Patent Laid-Open No. 10-209292 discloses a protection circuit for protecting an element from ESD (Electro-Static Discharge: ESD) in a semiconductor device. The protection circuit in Japanese Patent Laid-Open No. 10-209292 includes a transistor M2 which connects a voltage line and a ground line. If a surge voltage is generated in the voltage line, the transistor M2 is turned on, and a current flows from the voltage line to the ground line, discharging the surge voltage in the voltage line. Japanese Patent Laid-Open No. 10-209292 discloses that an internal circuit is protected from ESD as a result.

SUMMARY OF THE INVENTION

In a protection circuit of Japanese Patent Laid-Open No. 10-209292, voltage fluctuations in a voltage line is transmitted to the gate of a transistor M1 via a gate-drain parasitic capacitance of the transistor M1. The voltage fluctuations in the gate of the transistor M1 turns on the transistor M1, and a voltage for turning on a transistor M2 is applied to the gate of the transistor M2.

As described in Japanese Patent Laid-Open No. 10-209292, however, capacitive coupling for transmitting the voltage fluctuations to the gate of the transistor M1 may be lacking if only a gate-drain parasitic capacitance of a MOS is used as a capacitive element in the protection circuit. A gate-source capacitance of the transistor M1 cannot be charged, and thus it may be impossible to sufficiently secure a gate-source voltage Vgs for turning on the transistor M1. As a result, the function of the protection circuit may be degraded.

Japanese Patent Laid-Open No. 10-209292 discloses additional use of the capacitive element. However, it does not disclose the concrete structure of the capacitive element. In order to use it for a high-voltage terminal, the high breakdown voltage of the capacitive element is required. For example, an oxide film capacitance obtained by thickening a gate oxide film or a pn-junction capacitance utilizing a pn-junction can be used as the capacitive element in the protection circuit. In order to form the oxide film capacitance, however, a process of forming a thick oxide film is needed, increasing the number of steps in the process. The pn-junction capacitance is poor in area efficiency, increasing cost.

As described above, in the technique disclosed in Japanese Patent Laid-Open No. 10-209292, it is difficult, in particular, to appropriately protect a terminal to which a high voltage is applied.

The present invention provides a technique advantageous in appropriately protecting an internal circuit from ESD in a semiconductor device.

According to some embodiments, a semiconductor device comprising: a first transistor that includes a first primary terminal, a second primary terminal, and a first control terminal; a second transistor that includes a third primary terminal, a fourth primary terminal, and a second control terminal; and a first resistive element, wherein the first primary terminal and the third primary terminal are connected to a first voltage line, the second primary terminal and one terminal of the first resistive element are connected to a second voltage line, the first control terminal, the second control terminal, the fourth primary terminal, and the other terminal of the first resistive element are connected to each other so as to form one node, a potential change in the third primary terminal is transmitted to the first control terminal via capacitive coupling between the third primary terminal and the one node, and a transmitted potential change turns on the first transistor, is provided.

According to some other embodiments, a liquid discharge head substrate comprising: a semiconductor device; a heating element configured to heat a liquid; and a fifth transistor configured to drive the heating element wherein the semiconductor device comprises: a first transistor that includes a first primary terminal, a second primary terminal, and a first control terminal; a second transistor that includes a third primary terminal, a fourth primary terminal, and a second control terminal; and a first resistive element, wherein the first primary terminal and the third primary terminal are connected to a first voltage line, the second primary terminal and one terminal of the first resistive element are connected to a second voltage line, the first control terminal, the second control terminal, the fourth primary terminal, and the other terminal of the first resistive element are connected to each other so as to form one node, a potential change in the third primary terminal is transmitted to the first control terminal via capacitive coupling between the third primary terminal and the one node, and a transmitted potential change turns on the first transistor, is provided.

According to some other embodiments, a liquid discharge head substrate comprising: a semiconductor device; a heating element configured to heat a liquid; and a fifth transistor configured to drive the heating element wherein the semiconductor device comprises: a first transistor that includes a first primary terminal, a second primary terminal, and a first control terminal; a second transistor that includes a third primary terminal, a fourth primary terminal, and a second control terminal; a first resistive element; a capacitive element that includes a first terminal and a second terminal; a third transistor that includes a fifth primary terminal connected to the second terminal, a sixth primary terminal, and a third control terminal; and a driving unit formed by at least one transistor that includes a fourth transistor and configured to cause an insulation breakdown of the capacitive element by supplying a control signal to the third control terminal, wherein the first primary terminal, the third primary terminal, and the first terminal are connected to a first voltage line, the second primary terminal, one terminal of the first resistive element, and the sixth primary terminal are connected to a second voltage line, the first control terminal, the second control terminal, the fourth primary terminal, and the other terminal of the first resistive element are connected to each other so as to form one node, a potential change in the third primary terminal is transmitted to the first control terminal via capacitive coupling between the third primary terminal and the one node, and a transmitted potential change turns on the first transistor, is provided.

Further features of the present invention will become apparent from the following description of exemplary embodiments (with reference to the attached drawings).

DESCRIPTION OF THE EMBODIMENTS

Figure 1:
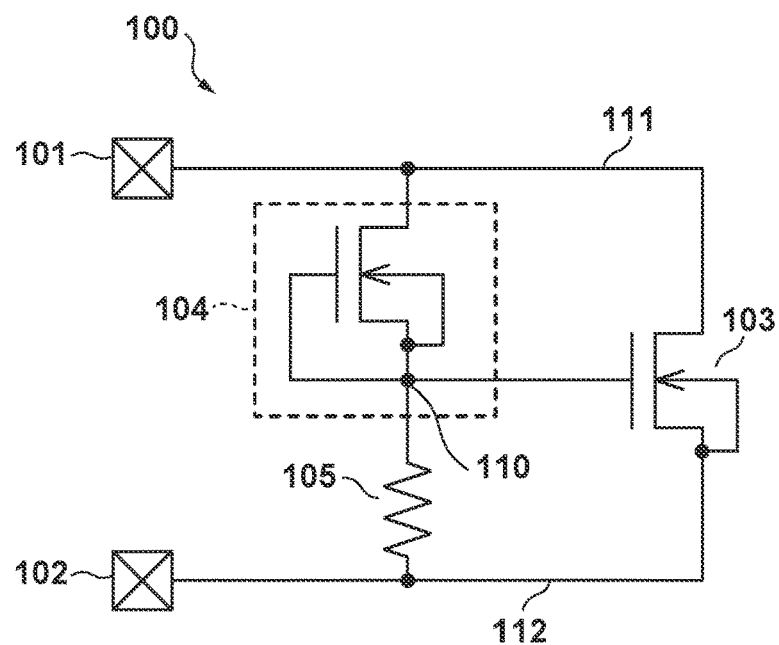
FIG. 1 is a circuit diagram showing the circuit arrangement of a semiconductor device according to an embodiment of the present invention.

Practical embodiments of a semiconductor device of the present invention will be described below with reference to the accompanying drawings. Note that in a description and the drawings below, common reference numerals denote common arrangements throughout the plurality of drawings. Therefore, the common arrangements will be described by referring to the plurality of drawings mutually, and descriptions of the arrangements denoted by the common reference numerals will be omitted as needed.

The structure of a semiconductor device according to an embodiment of the present invention will be described with reference to FIGS. 1 and 2. FIG. 1 is a circuit diagram showing the circuit arrangement of a semiconductor device 100 according to a first embodiment of the present invention. The semiconductor device 100 forms a protection circuit for protecting an internal circuit from Electro-Static Discharge (ESD). The semiconductor device 100 includes a transistor 103, a transistor 104, and a resistive element 105. One primary terminal (drain) of the transistor 103 and one primary terminal (drain) of the transistor 104 are connected to a voltage line 111. The other primary terminal (source) of the transistor 103 and one terminal of the resistive element 105 is connected to a voltage line 112. The control terminal (gate) of the transistor 103, the control terminal (gate) and the other primary terminal (source) of the transistor 104, and the other terminal of the resistive element 105 are connected to each other so as to form one node 110. A high voltage $V_H$ is supplied from a terminal 101 to the voltage line 111, and a ground potential is supplied from a terminal 102 to the voltage line 112. DMOS (Double-Diffused MOS) transistors each serving as a high-voltage tolerant element having a higher breakdown voltage than an ordinary transistor are used for the transistor 103 and the transistor 104.

Figure 2:
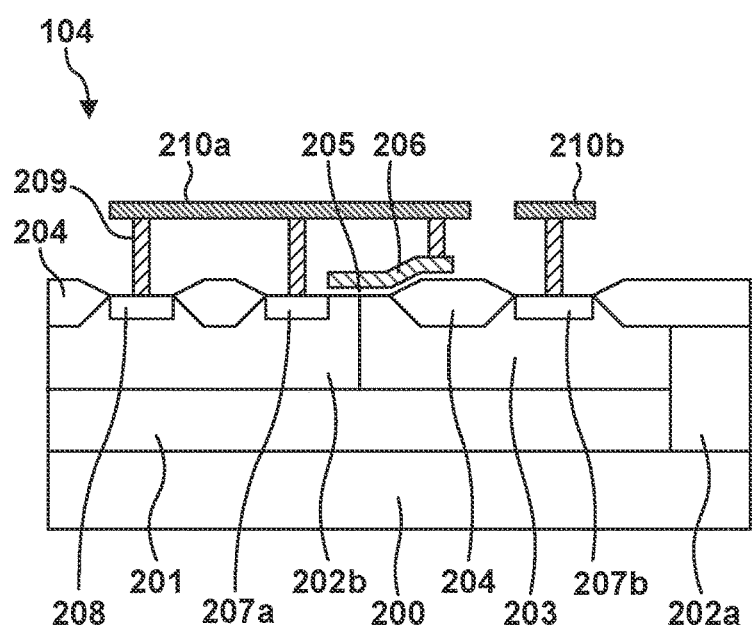
FIG. 2 is a view showing the sectional structure of the semiconductor device in FIG. 1.

FIG. 2 shows the sectional structure of the transistor 104 surrounded by a dotted line in FIG. 1. A buried layer 201 serving as an n-type semiconductor region and a well region 202a serving as a p-type semiconductor region are arranged in a p-type semiconductor region 200. The semiconductor region 200 may be, for example, a p-type semiconductor substrate of silicon or the like, or a p-type well region formed on a substrate. In this embodiment, a p-type semiconductor substrate of silicon is used for the semiconductor region 200. A well region 202b serving as a p-type semiconductor region and a well region 203 serving as an n-type semiconductor region are arranged on the buried layer 201. A gate electrode 206 is arranged above the well region 202b and the well region 203 through a gate insulating film 205. The gate electrode 206 includes portions arranged on the well region 202b, the well region 203, and a field insulating film 204, respectively. Accordingly, the substantial gate insulating film thickness of a portion contacting the well region 203 on the gate insulating film 205 and the field insulating film 204 is thicker than the gate insulating film thickness of a portion contacting the well regions 202b and 203 only on the gate insulating film 205. The gate insulating film 205 may use, for example, silicon oxide, silicon nitride, silicon oxynitride, or the like. The gate electrode 206 may be formed by using, for example, polysilicon. Diffusion regions 207a and 207b are n-type high-concentration diffusion regions. A diffusion region 208 is a p-type high-concentration diffusion region. The diffusion regions 207a, 207b, and 208 form respective electrodes (terminals) of a source, a drain, and a back gate, respectively as will be described later. The gate electrode 206 and the diffusion regions 207a, 207b, and 208 are electrically connected to wirings 210a and 210b, respectively, via contact portions 209. For example, a metal or the like is used for the contact portions 209 and the wirings 210a and 210b. However, manufacturing methods and the structures thereof are not limited as long as they are electrically connected to the respective electrodes. The field insulating films 204 each having a LOCOS (LOCal Oxidation of Silicon) structure are arranged between the respective electrodes and between the elements such as the transistors or the like. Each field insulating film 204 may have an STI (Shallow Trench Isolation) structure. The conductivity types of semiconductors described above including the conductivity types of semiconductors to be described later may be opposite from each other.

The arrangement of the transistor 104 will now be described. The gate electrode 206 is arranged above the well region 202b and the well region 203 adjacent to each other through the gate insulating film 205. A region in which the well region 202b and the gate electrode 206 overlap becomes a channel region. In this embodiment, the transistor 104 is an LDMOS (Laterally Diffused MOS) transistor that is a lateral DMOS with the channel region being formed along the surface of the semiconductor substrate, as shown in FIG. 2. The diffusion region 207a forms a source electrode (source region), and the diffusion region 208 forms a back gate electrode. As shown in FIGS. 1 and 2, the source electrode and the gate electrode 206 of the transistor 104 are short-circuited. The well region 203 functions as an electric field relaxation region in the drain region and extends below the gate electrode 206. The diffusion region 207b formed in the well region 203 forms a drain electrode (drain region). The n-type well region 203 is lower in impurity concentration than the diffusion region 207b having the same n conductivity type. The field insulating film 204 is arranged on the well region 203. The drain side of the gate electrode 206 has a structure which extends on the field insulating film 204, that is, a so-called LOCOS offset structure. This makes it possible to secure a gate-drain breakdown voltage even if the transistor 104 is in an OFF state, that is, a state in which the gate electrode and the source electrode are short-circuited, and the voltage of the drain electrode rises to the high voltage $V_H$. The transistor 103 may also have the same arrangement as the transistor 104. However, it differs in arrangement of the wirings 210a and 210b, and the gate electrode 206 and the source electrode are not short-circuited. The gate insulating film 205 and the field insulating films 204 may be formed by the same material. The gate insulating film 205 and the field insulating films 204 may be formed in different processes. However, their structures include insulating films formed by the same material and having portions different in thickness.

Parasitic capacitances which exist in the transistor 104 will now be described. Pn-junction parasitic capacitances $C_{ds1}$ exist between the well region 202b and the well region 203, and between the well region 202b and the buried layer 201. A parasitic capacitance $C_{gd1}$ exists between the well region 203 and the gate electrode 206. A parasitic capacitance $C_{gs1}$ exists between the well region 202b and the gate electrode 206.

The operation of the semiconductor device 100 shown in FIG. 1 will now be described. A state before a high surge voltage is applied, by ESD, from the terminal 101 to the voltage line 111 at high speed will be considered. The parasitic capacitances $C_{gd1}$ and $C_{ds1}$ of the transistor 104 do not transmit a low-frequency signal, and thus the gate potential of the transistor 103 becomes a ground potential of 0 V. Consequently, the transistor 103 is turned off, and no current flows between the source and drain of the transistor 103. A case will now be considered in which the high surge voltage is applied, by ESD, from the terminal 101 to the voltage line 111 at high speed. The parasitic capacitances $C_{gd1}$ and $C_{ds1}$ of the transistor 104 exist in series to a parasitic capacitance $C_{gs2}$ which exists between the source electrode and the gate electrode of the transistor 103, and these capacitances undergo capacitive coupling and work as coupling capacitances. A parasitic capacitance $C_{gd2}$ which exists between the gate electrode and the drain electrode of the transistor 103 also exists in parallel to the parasitic capacitances $C_{gd1}$ and $C_{ds1}$ of the transistor 104, and thus these capacitances undergo capacitive coupling and work as coupling capacitances. Therefore, the parasitic capacitances $C_{gd1}$, $C_{ds1}$, and $C_{gd2}$ charge the gate-source parasitic capacitance $C_{gs2}$ of the transistor 103 and turns on the transistor 103. That is, when the surge voltage is applied to the drain of the transistor 104, a potential change in the drain of the transistor 104 is transmitted to the gate electrode of the transistor 103 by capacitive coupling between the node 110 and the drain of the transistor 104. As a result, the transistor 103 is turned on, and a surge current flows through the terminal 102 via the voltage line 112, preventing the surge current from flowing through the internal circuit. Each of the parasitic capacitances $C_{gd1}$, $C_{gs1}$, and $C_{ds1}$ has voltage dependence. Therefore, if a surge voltage $V_{sur}$ to be applied is high, a depletion layer of each parasitic capacitance $C_{ds1}$ becomes thick, and the parasitic capacitance $C_{gd1}$ loses its effect. When the surge voltage rises, however, the voltage dependence of each parasitic capacitance $C_{ds1}$ is weak. Therefore, the depletion layer of each parasitic capacitance $C_{ds1}$ is thin, and the parasitic capacitance $C_{gd1}$ has its effect. Note that the value of a gate-source voltage $V_{gs}$ of the transistor 103 can be given by:

$$V_{gs} = \frac{C_{ds1} + C_{gd1} + C_{gd2}}{C_{ds1} + C_{gd1} + C_{gd2} + C_{gs2}} \cdot V_{sur} \quad (1)$$

It is possible to increase the gate-source voltage $V_{gs}$ of the transistor 103 by making the parasitic capacitances $C_{gd1}$ and $C_{ds1}$ of the transistor 104 larger than that of equation (1). It becomes possible to turn on the transistor 103 more reliably and pass the surge current sufficiently by increasing the gate-source voltage $V_{gs}$ of the transistor 103. A time during which the transistor 103 is ON is decided by a time constant $\tau=(C_{gd1}+C_{gd2}+C_{ds1})\times R$ by the parasitic capacitance $C_{gd2}$ of the transistor 103, the parasitic capacitances $C_{gd1}$ and $C_{ds1}$ of the transistor 104, and the resistive value of the resistive element 105. Therefore, first, the respective values of the parasitic capacitances $C_{gd1}$, $C_{gs1}$, $C_{gd2}$, and $C_{gs2}$ are decided such that the surge current can flow sufficiently. More specifically, the respective values of the parasitic capacitances $C_{gd1}$, $C_{gs1}$, $C_{gd2}$, and $C_{gs2}$ can be decided by deciding the gate lengths and the gate widths of the transistors 103 and 104 appropriately. Then, the time during which the transistor 103 is ON is adjusted by selecting the resistive value of the resistive element 105 appropriately.

As described above, it is possible to turn on the transistor 103 sufficiently by implementing the capacitance of the protection circuit for protecting the internal circuit from ESD by using the DMOS transistor which connects the gate electrode and the source electrode in the semiconductor device 100. A capacitance required for the semiconductor device 100 is implemented by a parasitic capacitance, eliminating the need to add a capacitive element or the like. A high breakdown voltage is required of a capacitance element used for a protection circuit to which a high voltage like ESD is applied. For example, a MOS capacitance, a pn-junction capacitance utilizing a p-n junction, or the like can be used as the capacitive element of the protection circuit. If the MOS capacitance is used as the capacitive element, an insulating film thicker than other transistors included in the internal circuit or the like needs to be formed in order to make a breakdown voltage higher than those of the other transistors. This requires, for example, an additional step of forming the thick insulating film in addition to a step of forming the gate insulating film of a transistor, incurring the possibility of increasing the number of steps in a manufacturing process. The pn-junction capacitance is poor in area efficiency, making it difficult to downsize the semiconductor device. In contrast, the semiconductor device 100 described in this embodiment functions as a capacitance by innovating the connection of the transistor 103. It is therefore possible to arrange a capacitive element having a large capacitive value without adding the capacitive element. As a result, an increase in the number of steps in the manufacturing process can be suppressed, and further the area efficiency can also be improved.

Figure 3:
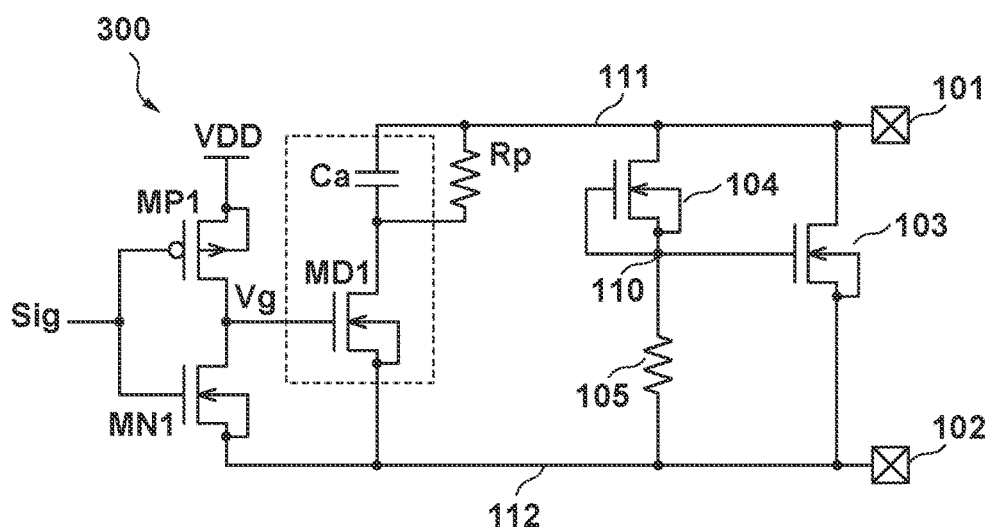
FIG. 3 is a circuit diagram showing the circuit arrangement of a semiconductor device according to an embodiment of the present invention.

The structure of a semiconductor device according to an embodiment of the present invention will be described with reference to FIGS. 3 and 4. FIG. 3 is a circuit diagram showing the circuit arrangement of a semiconductor device 300 according to a second embodiment of the present invention. The semiconductor device 300 includes a capacitance element Ca which forms an anti-fuse element, and transistors 103 and 104 and a resistive element 105 each having the same arrangement as the above-described semiconductor device 100 as a protection circuit which protects the anti-fuse element. The semiconductor device 300 also includes a transistor MD1, a transistor MP1, a transistor MN1, and a resistive element Rp. FIG. 3 shows a state before information is written in the anti-fuse element, in other words, before the capacitance element Ca is broken.

The transistor MP1 is a p-type MOS transistor, and the transistor MN1 is an n-type MOS transistor. The transistors MP1 and MN1 use ordinary MOS transistors, and are lower in breakdown voltage than DMOS transistors used for the transistors 103 and 104. In other words, the transistors 103 and 104 are higher in breakdown voltage than the transistors MP1 and MN1. The transistor MD1 is a DMOS transistor like the transistors 103 and 104, and higher in breakdown voltage than the transistors MP1 and MN1, a detail of which will be described later. The back gate and one primary terminal (source) of the transistor MP1 are connected to a logic power supply voltage $V_{DD}$. The back gate and one primary terminal (source) of the transistor MN1 are connected to a voltage line 112. The logic power supply voltage $V_{DD}$ is lower in potential than a high voltage $V_H$ supplied to a terminal 101. The voltage line 112 is connected to a terminal 102 and a ground potential as described above. A control signal Sig is input to the control electrode (gate) of the transistor MP1 and the control electrode (gate) of the transistor MN1. The other primary terminal (drain) of the transistor MP1 and the other primary terminal (drain) of the transistor MN1 are connected to each other, and form an inverter circuit serving as a driving unit by the transistor MP1 and the transistor MN1. A control signal Vg serving as an output signal of the inverter circuit (driving unit) is input to the control electrode (gate) of the transistor MD1 which controls the write in the anti-fuse element. The back gate and one primary electrode (source) of the transistor MD1 are connected to the voltage line 112. The other primary terminal (drain) of the transistor MD1 is connected to one terminal of the capacitance element Ca which forms the anti-fuse element. The other terminal of the capacitance element Ca is connected to a voltage line 111. The high voltage $V_H$ applied when the information is written in the anti-fuse element is supplied from the terminal 101 to the voltage line 111. One terminal of the resistive element Rp is connected to the drain of the transistor MD1 and one terminal of the capacitance element Ca so as to form one node. The other terminal of the resistive element Rp is connected to the voltage line 111.

Figure 4:
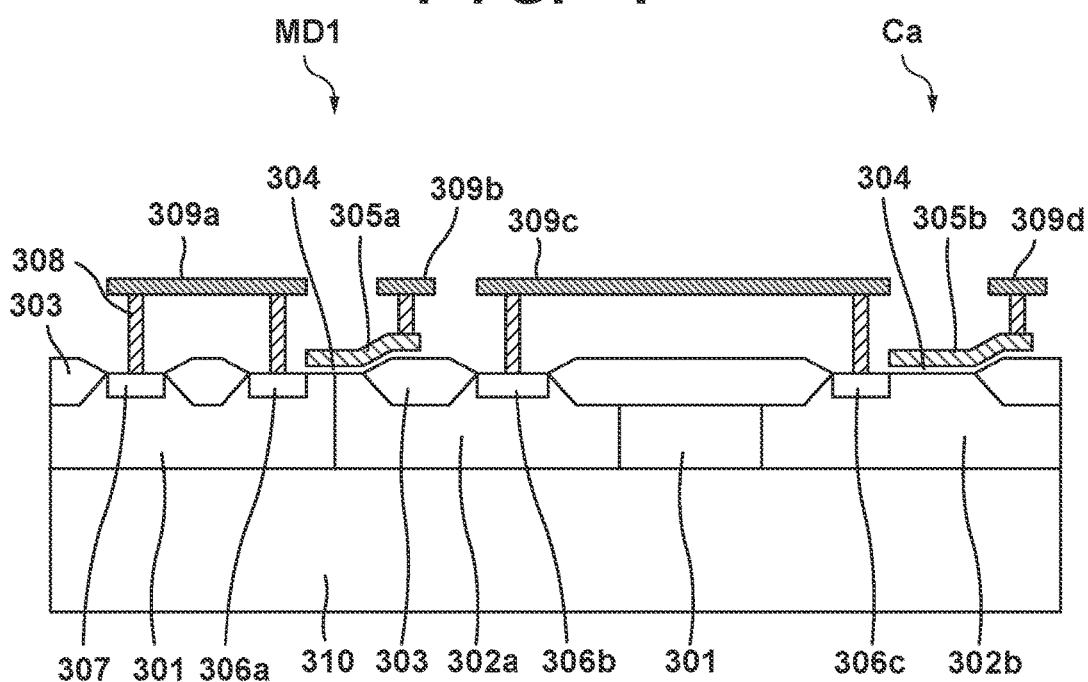
FIG. 4 is a view showing the sectional structure of the semiconductor device in FIG. 3.

Then, FIG. 4 shows the sectional structure of the capacitance element Ca and the transistor MD1 surrounded by a dotted line shown in FIG. 3. A well region 301 serving as a p-type semiconductor region, and well regions 302a and 302b each serving as an n-type semiconductor region are arranged on a p-type semiconductor region 310. In this embodiment, like the semiconductor region 200 of the first embodiment described above, a p-type semiconductor substrate of silicon is used for the semiconductor region 310. The well region 301 has a common impurity concentration with a p-type well region of the transistor MN1 which forms a logic circuit of the driving unit. Each of the well regions 302a and 302b has a common impurity concentration with an n-type well region of the transistor MP1 which forms a logic circuit of the driving unit. Note that the impurity concentrations of the well regions 302a and 302b need to be set with respect to the impurity concentration of the semiconductor region 310 such that a breakdown voltage between the semiconductor region 310, and the well regions 302a and 302b becomes higher than the high voltage $V_H$. A field insulating film 303 has a LOCOS structure. A gate insulating film 304 of the transistor MD1 uses, for example, silicon oxide, and is formed simultaneously with a step of forming the gate insulating films of the transistors MP1 and MN1 each forming the logic circuit of the driving unit. The capacitance element Ca which forms the anti-fuse element has a MOS structure, and the gate insulating film 304 which forms this capacitance element Ca is also formed simultaneously with the gate insulating films of the transistors MD1, MP1, and MN1. A gate electrode 305a is the gate electrode of the transistor MD1, and a gate electrode 305b is an electrode which forms the other terminal of the capacitance element Ca serving as the anti-fuse element. The gate electrodes 305a and 305b are formed by using, for example, polysilicon. Diffusion regions 306a to 306c are n-type high-concentration diffusion regions. A diffusion region 307 is a p-type high-concentration diffusion region. The gate electrodes 305a and 305b, and the diffusion regions 306a to 306c and 307 can be formed in the same step as a step of forming the gate electrodes of the transistors MP1 and MN1 each forming the logic circuit of the driving unit, and a step of forming the respective diffusion regions. The gate electrodes 305a and 305b, and the diffusion regions 306a to 306c and 307 form their respective electrodes (terminals) as will be described later, and are electrically connected to wirings 309a to 309d via contact portions 308. For example, a metal or the like is used for the contact portions 308 and the wirings 309a to 309d. However, manufacturing methods and the structures thereof are not limited as long as they are electrically connected to the respective electrodes.

The arrangement of the transistor MD1 will now be described. The gate electrode 305a is arranged above the well region 301 and the well region 302a adjacent to each other through the gate insulating film 304. A region in which the well region 301 and the gate electrode 305a overlap becomes a channel region. In this embodiment, like the transistors 103 and 104, the transistor MD1 is an LDMOS transistor that is a lateral DMOS with the channel region being formed along the surface of the semiconductor substrate. The high-concentration n-type diffusion region 306a forms a source electrode (source region), and the diffusion region 307 forms a back gate electrode. The well region 302a functions as an electric field relaxation region in the drain region and extends below the gate electrode 305a. The n-type well region 302a is lower in impurity concentration than the diffusion region 306b having the same n conductivity type. The diffusion region 306b formed in the well region 302a forms a drain electrode (drain region). The field insulating film 303 is arranged on the well region 302a. The drain side of the gate electrode 305a has a structure which extends on the field insulating film 303, that is, a so-called LOCOS offset structure. This makes it possible to secure a gate-drain breakdown voltage even if the transistor MD1 is in an OFF state, that is, a state in which the potential of the gate electrode 305a is a ground potential, and the voltage of the drain electrode rises to the high voltage $V_H$. As described above, the transistor MD1 has the same arrangement as the transistors 103 and 104.

The capacitance element Ca which forms the anti-fuse element will now be described. The capacitance element Ca has a MOS structure in which the gate insulating film 304 arranged on the n-type well region 302b is sandwiched by the gate electrode 305b and a lower electrode formed by the n-type diffusion region 306c. In the arrangement shown in FIG. 4, the diffusion region 306c is formed only in an opening portion of the contact portion 308 for connecting the wiring 309c. However, the diffusion region 306c may be formed in an entire region which overlaps the gate electrode 305b through the gate insulating film 304. Further, in the arrangement shown in FIG. 4, the diffusion region 306c is connected to the drain of the transistor MD1. However, the present invention is not limited to this. For example, the gate electrode 305b is connected to the drain of the transistor MD1, and the high voltage $V_H$ may be supplied to the diffusion region 306c via the wiring 309d (voltage line 111). Furthermore, in the arrangement shown in FIG. 4, the electrodes of the capacitance element Ca are formed by the n-type well region 302b and the gate electrode 305b. However, an arrangement is also possible in which the p-type well region is used.

A connection state of each electrode will now be described. The wiring 309a is connected to the back gate electrode and the source electrode of the transistor MD1 via the contact portions 308, and the ground potential is supplied. The wiring 309b is connected to the gate electrode 305a of the transistor MD1 via the contact portion 308 and receives the control signal Vg serving as the output signal of the inverter circuit of the driving unit shown in FIG. 3. The wiring 309c is connected, via the contact portions 308, to the drain electrode of the transistor MD1 and the diffusion region 306c serving as the lower electrode of the anti-fuse element. The wiring 309d is connected to the gate electrode 305b of the capacitance element Ca via the contact portion 308, and the high voltage $V_H$ is supplied at the time of the write.

As described above, the gate insulating films of the transistors MP1 and MN1, the gate insulating film 304 of the capacitance element Ca, and the gate insulating film 304 of the transistor MD1 may be formed in the same step. By forming the gate insulating films in the same step, the capacitance element Ca and the transistors MD1, MP1, and MN1 can be formed without needing a plurality of gate insulating film thicknesses, and the number of steps in a manufacturing process is not increased. As for the transistors 103 and 104, a gate insulating film 205 may be formed simultaneously when the gate insulating films of the capacitance element Ca and the transistors MD1, MP1, and MN1 are formed. Consequently, since the respective gate insulating film thicknesses of the capacitance element Ca and the transistors 103, 104, MD1, MP1, and MN1 are the same, the number of steps need not be increased in the manufacturing process. In the capacitance element Ca and the transistors 103, 104, MD1, MP1, and MN1, the well regions and the diffusion regions having the same impurity concentration can be formed in the same step such as ion implantation. As described above, in this embodiment, the transistors having the different breakdown voltages between the transistors MP1 and MN1, and the transistors 103, 104, and MD1 can be formed while suppressing an increase in the number of steps in the manufacturing process.

An operation when the information is written in the anti-fuse element will now be described. When the information is written in the anti-fuse element, first, the control signal Vg is supplied from the inverter circuit of the driving unit by inputting a Low-level signal to the control signal Sig, turning on the transistor MD1. Consequently, a current flows through the resistive element Rp and the transistor MD1. Note that letting a resistance Rd be the ON resistance of the transistor MD1, a value of a voltage $V_{ca}$ applied to the two terminals of the capacitance element Ca can be given by:

$$V_{ca} = V_H \cdot \frac{Rp}{Rp + Rd} \quad (2)$$

The information is written in the anti-fuse element when the voltage $V_{ca}$ becomes equal to or higher than a voltage which causes an insulation breakdown of the gate insulating film 304 of the capacitance element Ca. A method of reading out the information written in the anti-fuse element includes, for example, a method of measuring a change in the impedance of the anti-fuse element or the like.

Figure 5:
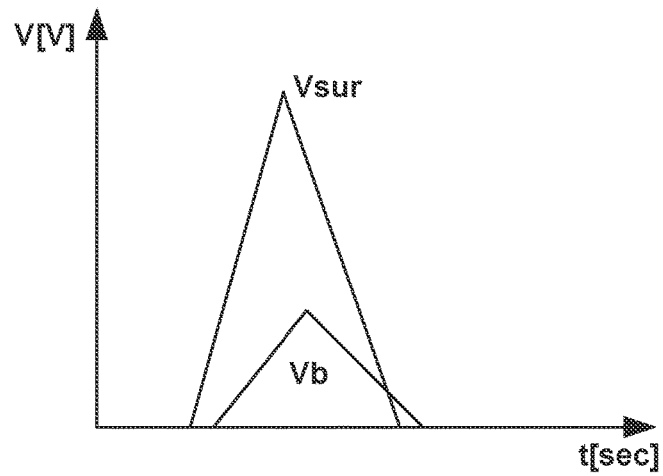
FIG. 5 is a graph showing the waveforms of voltages applied to the two terminals of an anti-fuse element in FIG. 3.

An operation when a surge voltage is applied to the semiconductor device 300 will now be described with reference to FIG. 5. First, a case will be considered in which the semiconductor device 300 of FIG. 3 does not include a protection circuit having the same arrangement as the semiconductor device 100 shown in FIG. 1. When a high surge voltage is applied, by ESD, from the terminal 101 to the voltage line 111 at high speed, a high surge voltage $V_{sur}$ is applied to one terminal of the capacitance element Ca at high speed. Letting a voltage $V_b$ be a voltage at the other terminal of the capacitance element Ca, the voltage $V_b$ delays more than the surge voltage $V_{sur}$, generating a voltage. The voltage $V_b$ delays because a filter is formed by a capacitance which parasites on the resistive element Rp. This capacitance may be a parasitic capacitance generated not only by the resistive element Rp but also by the wirings, the transistor MD1, or the like. If the voltage $V_b$ delays more than the surge voltage $V_{sur}$, making a potential difference between the two terminals of the capacitance element Ca equal to or higher than a voltage which breaks the capacitance element Ca, the gate insulating film 304 of the capacitance element Ca undergoes the insulation breakdown. That is, the information may be written in the anti-fuse element by ESD.

Meanwhile, if the high surge voltage $V_{sur}$ is applied, by ESD, to the voltage line 111 of the semiconductor device 300 shown in FIG. 3 at high speed, parasitic capacitances $C_{gd1}$ and $C_{ds1}$ of the transistor 104, and a parasitic capacitance $C_{gd2}$ of the transistor 103 undergo capacitive coupling and work as coupling capacitances. Therefore, a gate-source parasitic capacitance $C_{gs2}$ of the transistor 103 is charged, turning on the transistor 103. As a result, a surge current flows through the voltage line 112 of the transistor 103, preventing the surge current from flowing through an internal circuit. This makes it possible to prevent the information from being written in the capacitance element Ca which forms the anti-fuse element.

The capacitance element Ca which forms the anti-fuse element is used by applying the high voltage $V_H$ and causing the insulation breakdown of the gate insulating films 304. Therefore, it is formed by a low-voltage tolerant element. If a protection circuit using a transistor having the same breakdown voltage as the transistors MP1 and MN1 is used, the protection circuit is broken when the surge voltage is applied. Consequently, the protection circuit does not operate and in addition, the capacitance element Ca is broken. Thus, a low-voltage tolerant protection circuit has no effect. Therefore, as described in this embodiment, a high-voltage tolerant protection circuit using the DMOS transistors like the transistors 103 and 104 is needed. The capacitance element Ca is used by applying the high voltage $V_H$ and causing a breakdown, and thus the protection circuit should not operate for a DC voltage, but needs to operate only for an AC signal. Accordingly, the protection circuit of the anti-fuse element has a high breakdown voltage, and a circuit which operates for the high-speed surge voltage is required. A protection circuit formed by the semiconductor device 100 shown in FIG. 1 embedded in the semiconductor device 300 has a high breakdown voltage and operates only for the high-speed surge voltage, having an effect as the protection circuit of the anti-fuse element.

As described above, it is possible, by using the semiconductor device 300 described in this embodiment, to prevent an erroneous write by ESD in the capacitance element Ca which forms the anti-fuse element.

Figure 6:
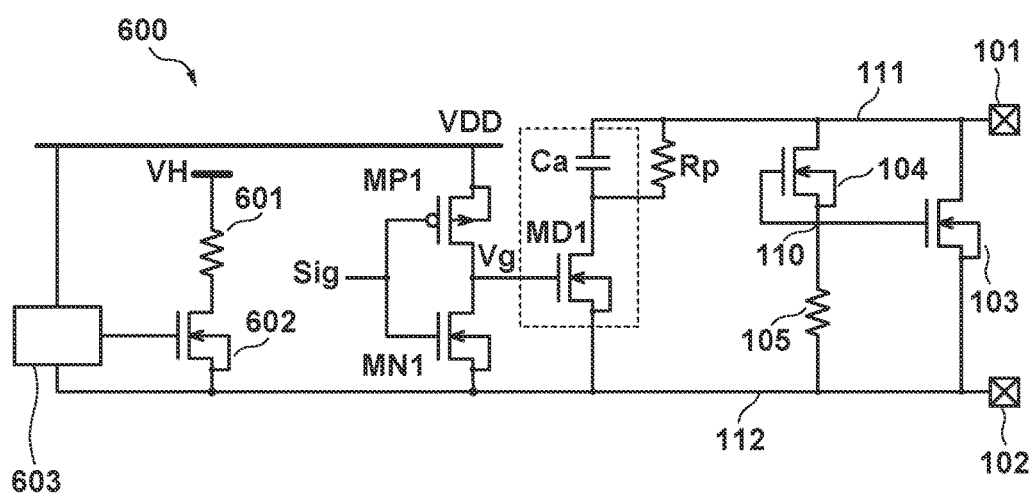
FIG. 6 is a circuit diagram showing the circuit arrangement of a liquid discharge head substrate according to an embodiment of the present invention.

The structure of a liquid discharge head substrate according to an embodiment of the present invention will be described with reference to FIG. 6. FIG. 6 is a circuit diagram showing the circuit arrangement of a liquid discharge head substrate 600 according to a third embodiment of the present invention. The liquid discharge head substrate 600 includes a heating element 601, a transistor 602, a control circuit 603, and the same circuit arrangement as the semiconductor device 300 of the second embodiment described above. The heating element 601 gives energy by heating a liquid serving as a printing material and discharges the liquid from an orifice. The heating element 601 may be a heat generating member which gives energy to the liquid by heating. Further, a piezoelectric element which gives energy to the liquid serving as the printing material by deformation may be used instead of the heating element 601. In FIG. 6, the heating element 601 is illustrated as a resistive element which gives thermal energy to the liquid. The transistor 602 is configured to drive the heating element 601. The control circuit 603 controls liquid discharge by controlling the transistor 602. One terminal of the heating element 601 is connected to a high voltage $V_H$ like a voltage line 111, and the other terminal is connected to the primary terminal (drain) of the transistor 602. The other primary terminal (source) of the transistor 602 is connected to a voltage line 112, and a ground potential is supplied. The control terminal (gate) of the transistor 602 is connected to the control circuit 603. The control circuit 603 is connected to a logic power supply voltage $V_{DD}$. Other elements which form the circuit may be the same as in the second embodiment described above.

The transistor 602 is connected to the high voltage $V_H$ like transistors 103, 104, and MD1, and thus a DMOS transistor having a higher breakdown voltage than transistors MP1 and MN1 is used. Like the transistors 103, 104, and MD1, the transistor 602 may be an LDMOS transistor. Further, like the transistors 103, 104, and MD1, the transistor 602 may have a LOCOS offset structure.

Meanwhile, a circuit included in the control circuit 603 is connected to the common logic power supply voltage $V_{DD}$ with the transistors MP1 and MN1, and thus may use an ordinary transistor. Therefore, each of the transistors 103, 104, MD1, and 602 can have a higher breakdown voltage than a transistor included in the control circuit 603.

As described above, the source and the back gate of the transistor MP1 and the control circuit 603 are connected to the common logic power supply voltage $V_{DD}$. Accordingly, all the gate insulating films of the transistors MP1 and MN1, and the transistor which forms the control circuit 603 can be formed in the same step. Further, all the transistors 103 and 104 which form a protection circuit, the transistor MD1 which controls write in an anti-fuse element, and the transistor 602 configured to drive the heating element 601 may use LDMOS transistors. In this case, the gate insulating films of the transistors 103, 104, MD1, and 602 and a capacitance element Ca can be formed in the same step as the gate insulating films of the transistors MP1 and MN1, as described above. That is, the gate insulating films of the transistors 103, 104, MD1, 602, MP1, and MN1 and the capacitance element Ca can have the same thickness. As described above, in the transistors 103, 104, MD1, and 602, the transistors MP1 and MN1, and the capacitance element Ca, well regions and diffusion regions each having the common impurity concentration can be used. It becomes possible, by using the arrangement described in this embodiment, to mount the anti-fuse element and the protection circuit of the anti-fuse element on the liquid discharge head substrate while suppressing an increase in the number of steps in a manufacturing process.

The three embodiments according to the present invention have been exemplified above. However, the present invention is not limited to these embodiments. The above-described embodiments can appropriately be modified and combined without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-077579, filed Apr. 7, 2016, which is hereby incorporated by reference wherein in its entirety.

What is claimed is:

1. A semiconductor device comprising:
   a first transistor that includes a first primary terminal, a second primary terminal, and a first control terminal;
   a second transistor that includes a third primary terminal, a fourth primary terminal, and a second control terminal; and
   a first resistive element,
      wherein the first primary terminal and the third primary terminal are connected to a first voltage line,
      the second primary terminal and one terminal of the first resistive element are connected to a second voltage line,
      the first control terminal, the second control terminal, the fourth primary terminal, and the other terminal of the first resistive element are connected to each other so as to form one node,
      a potential change in the third primary terminal is transmitted to the first control terminal via capacitive coupling between the third primary terminal and the one node,
      a transmitted potential change at the first control terminal turns on the first transistor, and
      the semiconductor device further comprises:
         a capacitive element which includes a first terminal connected to the first voltage line and a second terminal;
         a third transistor which includes a fifth primary terminal connected to the second terminal, a sixth primary terminal connected to the second voltage line, and a third control terminal; and
         a driving unit formed by at least one transistor which includes a fourth transistor and configured to cause an insulation breakdown of the capacitive element by supplying a control signal to the third control terminal.

2. The device according to claim 1, wherein each of the first transistor and the second transistor comprises a DMOS (Double-Diffused MOS) transistor.

3. The device according to claim 2, wherein each of the first transistor and the second transistor comprises an LDMOS (Laterally Diffused MOS) transistor.

4. The device according to claim 1, wherein each of the first transistor and the second transistor has a LOCOS offset structure.

5. The device according to claim 1, wherein each of the first transistor and the second transistor includes
   a first semiconductor region of a first conductivity type arranged in a semiconductor substrate,
   a second semiconductor region of a second conductivity type arranged adjacent to the first semiconductor region in the semiconductor substrate,
   a source region of the second conductivity type arranged in the first semiconductor region,
   a drain region of the second conductivity type arranged in the second semiconductor region,
   a gate electrode which includes a first portion arranged above the first semiconductor region, and a second portion and a third portion arranged above the second semiconductor region, and
   an insulating film that includes a fourth portion arranged between the first portion and the first semiconductor region and having a first thickness, a fifth portion arranged between the second portion and the second semiconductor region and having the first thickness, and a sixth portion arranged between the third portion and the second semiconductor region and having a second thickness thicker than the first thickness.

6. The device according to claim 1, wherein the first transistor and the second transistor are higher in breakdown voltage than the fourth transistor.

7. The device according to claim 1, wherein the third transistor is higher in breakdown voltage than the fourth transistor.

8. The device according to claim 1, wherein the third transistor comprises a DMOS transistor.

9. The device according to claim 1, wherein the third transistor comprises an LDMOS transistor.

10. The device according to claim 1, wherein the third transistor has a LOCOS offset structure.

11. The device according to claim 1, wherein the capacitive element has a MOS structure, and
a gate insulating film of the first transistor, a gate insulating film of the second transistor, a gate insulating film of the third transistor, a gate insulating film of the fourth transistor, and an insulating film that forms the capacitive element are equal to each other in thickness.

12. The device according to claim 1, further comprising a second resistive element connected between the first voltage line and the second terminal.

13. A liquid discharge head substrate comprising:
a semiconductor device;
a heating element configured to heat a liquid; and
a driving transistor configured to drive the heating element,
wherein the semiconductor device comprises:
a first transistor that includes a first primary terminal, a second primary terminal, and a first control terminal;
a second transistor that includes a third primary terminal, a fourth primary terminal, and a second control terminal; and
a first resistive element,
wherein the first primary terminal and the third primary terminal are connected to a first voltage line,
the second primary terminal and one terminal of the first resistive element are connected to a second voltage line,
the first control terminal, the second control terminal, the fourth primary terminal, and the other terminal of the first resistive element are connected to each other so as to form one node,
a potential change in the third primary terminal is transmitted to the first control terminal via capacitive coupling between the third primary terminal and the one node, and
a transmitted potential change at the first control terminal turns on the first transistor.

14. The device according to claim 1, further comprising:
a heating element configured to heat a liquid; and
a fifth transistor configured to drive the heating element.

15. The substrate according to claim 13, wherein the fifth transistor comprises a DMOS transistor.

16. The substrate according to claim 15, wherein the fifth transistor comprises an LDMOS transistor.

17. The substrate according to claim 13, wherein the fifth transistor has a LOCOS offset structure.

18. The device according to claim 13, wherein each of the first transistor and the second transistor includes
a first semiconductor region of a first conductivity type arranged in a semiconductor substrate,
a second semiconductor region of a second conductivity type arranged adjacent to the first semiconductor region in the semiconductor substrate,
a source region of the second conductivity type arranged in the first semiconductor region,
a drain region of the second conductivity type arranged in the second semiconductor region,
a gate electrode which includes a first portion arranged above the first semiconductor region, and a second portion and a third portion arranged above the second semiconductor region, and
an insulating film that includes a fourth portion arranged between the first portion and the first semiconductor region and having a first thickness, a fifth portion arranged between the second portion and the second semiconductor region and having the first thickness, and a sixth portion arranged between the third portion and the second semiconductor region and having a second thickness thicker than the first thickness.

19. The device according to claim 1, further comprising a third voltage line connected to the fourth transistor,
wherein a potential of the third voltage line is between a potential of the first voltage line and a potential of the second voltage line.

20. The device according to claim 13, further comprising a third voltage line connected to the driving transistor,
wherein a potential of the third voltage line is between a potential of the first voltage line and a potential of the second voltage line.

21. The device according to claim 1, wherein the second transistor includes a pn-junction capacitance that has voltage dependence.

22. The device according to claim 13, wherein the second transistor includes a pn-junction capacitance that has voltage dependence.

23. The device according to claim 5, wherein the first semiconductor region and the second semiconductor region constitute a pn-junction capacitance that has voltage dependence.

24. The device according to claim 18, wherein the first semiconductor region and the second semiconductor region constitute a pn-junction capacitance that has voltage dependence.

25. The device according to claim 5, further comprising a wiring, wherein the wiring connects the source region, the gate electrode, and the first semiconductor region to each other.

26. The device according to claim 18, further comprising a wiring, wherein the wiring connects the source region, the gate electrode, and the first semiconductor region to each other.

27. The device according to claim 1, wherein
when a surge voltage is applied to the first voltage line, a voltage between the first terminal and the second terminal of the capacitive element increases and the first transistor turns on before an insulation breakdown of the capacitive element occurs.

28. A semiconductor device comprising:
a first transistor that includes a first primary terminal, a second primary terminal, and a first control terminal;
a second transistor that includes a third primary terminal, a fourth primary terminal, and a second control terminal; and
a first resistive element,
wherein the first primary terminal and the third primary terminal are connected to a first voltage line, the second primary terminal and one terminal of the first resistive element are connected to a second voltage line, the first control terminal, the second control terminal, the fourth primary terminal, and the other terminal of the first resistive element are connected to each other so as to form one node, a potential change in the third primary terminal is transmitted to the first control terminal via capacitive coupling between the third primary terminal and the one node, a transmitted potential change at the first control terminal turns on the first transistor, wherein each of the first transistor and the second transistor includes a first semiconductor region of a first conductivity type arranged in a semiconductor substrate, a second semiconductor region of a second conductivity type arranged adjacent to the first semiconductor region in the semiconductor substrate, a source region of the second conductivity type arranged in the first semiconductor region, a drain region of the second conductivity type arranged in the second semiconductor region, a gate electrode which includes a first portion arranged above the first semiconductor region, and a second portion and a third portion arranged above the second semiconductor region, and an insulating film that includes a fourth portion arranged between the first portion and the first semiconductor region and having a first thickness, a fifth portion arranged between the second portion and the second semiconductor region and having the first thickness, and a sixth portion arranged between the third portion and the second semiconductor region and having a second thickness thicker than the first thickness.

* * * * *